(12) United States Patent
Jelinek et al.

(10) Patent No.: US 9,634,086 B2
(45) Date of Patent: Apr. 25, 2017

(54) METHOD OF MANUFACTURING SEMICONDUCTOR DEVICES USING LIGHT ION IMPLANTATION AND SEMICONDUCTOR DEVICE

(71) Applicant: Infineon Technologies AG, Neubiberg (DE)

(72) Inventors: Moriz Jelinek, Villach (AT); Johannes Georg Laven, Taufkirchen (DE); Hans-Joachim Schulze, Taufkirchen (DE); Werner Schustereder, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/952,337

(22) Filed: Nov. 25, 2015

(65) Prior Publication Data

US 2016/0172438 A1    Jun. 16, 2016

(30) Foreign Application Priority Data

Nov. 28, 2014    (DE) .................. 10 2014 117 538

(51) Int. Cl.
*H01L 21/265*    (2006.01)
*C30B 31/22*    (2006.01)
*H01L 29/06*    (2006.01)
*H01L 21/66*    (2006.01)
*H01L 29/10*    (2006.01)
*H01L 29/66*    (2006.01)
*H01L 29/78*    (2006.01)
*H01L 21/324*    (2006.01)

(52) U.S. Cl.
CPC .... *H01L 29/0634* (2013.01); *H01L 21/26506* (2013.01); *H01L 21/26586* (2013.01); *H01L 21/3242* (2013.01); *H01L 22/20* (2013.01); *H01L 29/0696* (2013.01); *H01L 29/1095* (2013.01); *H01L 29/66712* (2013.01); *H01L 29/7802* (2013.01); *H01L 22/14* (2013.01)

(58) Field of Classification Search
CPC .......... H01L 21/26586; H01L 21/3226; Y10S 148/006; Y10S 148/169; Y10S 148/935
See application file for complete search history.

(56) References Cited

U.S. PATENT DOCUMENTS

| | | | |
|---|---|---|---|
| 3,709,741 A | 1/1973 | Gibson et al. | |
| 6,355,541 B1 | 3/2002 | Holland et al. | |
| 2002/0084451 A1* | 7/2002 | Mohr | C30B 15/203 257/1 |
| 2015/0155380 A1* | 6/2015 | Schulze | H01L 29/32 257/330 |

* cited by examiner

*Primary Examiner* — Pamela E Perkins
(74) *Attorney, Agent, or Firm* — Murphy, Bilak & Homiller, PLLC

(57) ABSTRACT

A first doped region is formed in a single crystalline semiconductor substrate. Light ions are implanted through a process surface into the semiconductor substrate to generate crystal lattice vacancies between the first doped region and the process surface, wherein a main beam axis of an implant beam used for implanting the light ions deviates by at most 1.5 degree from a main crystal direction along which channeling of the light ions occurs. A second doped region with a conductivity type opposite to the first doped region is formed based on the crystal lattice vacancies and hydrogen atoms.

17 Claims, 17 Drawing Sheets

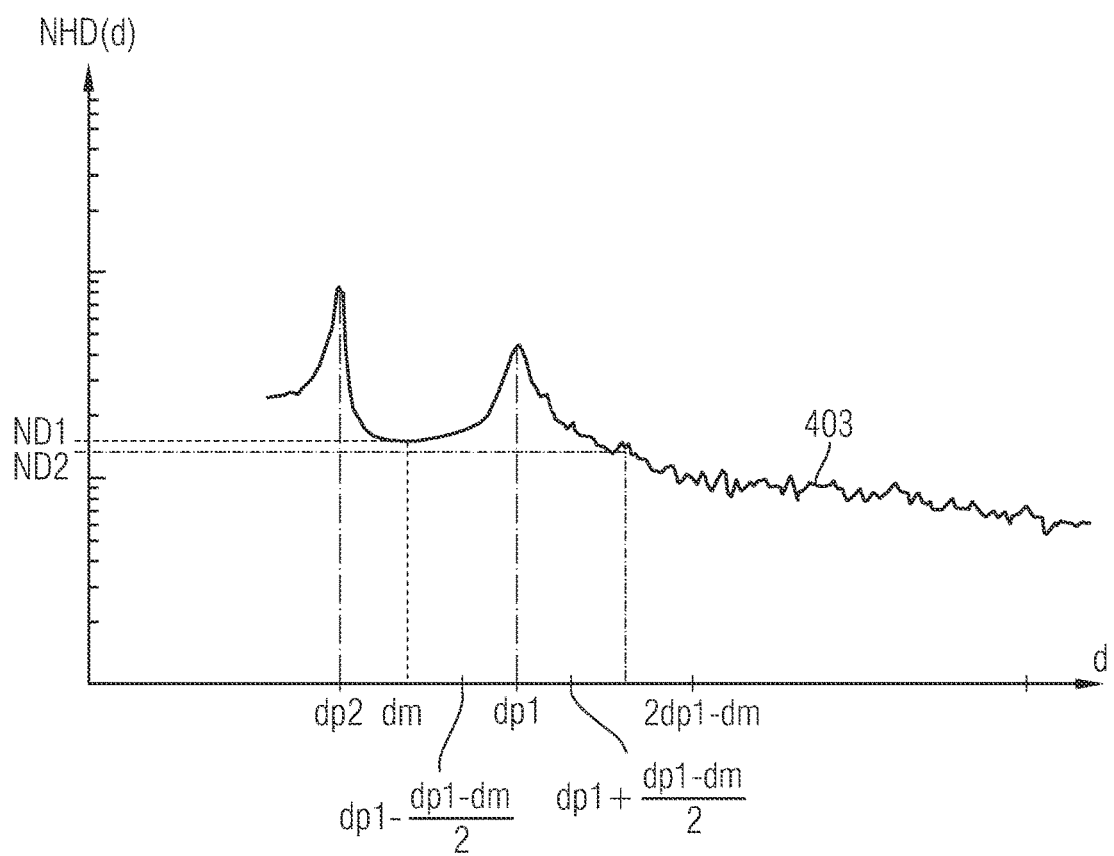

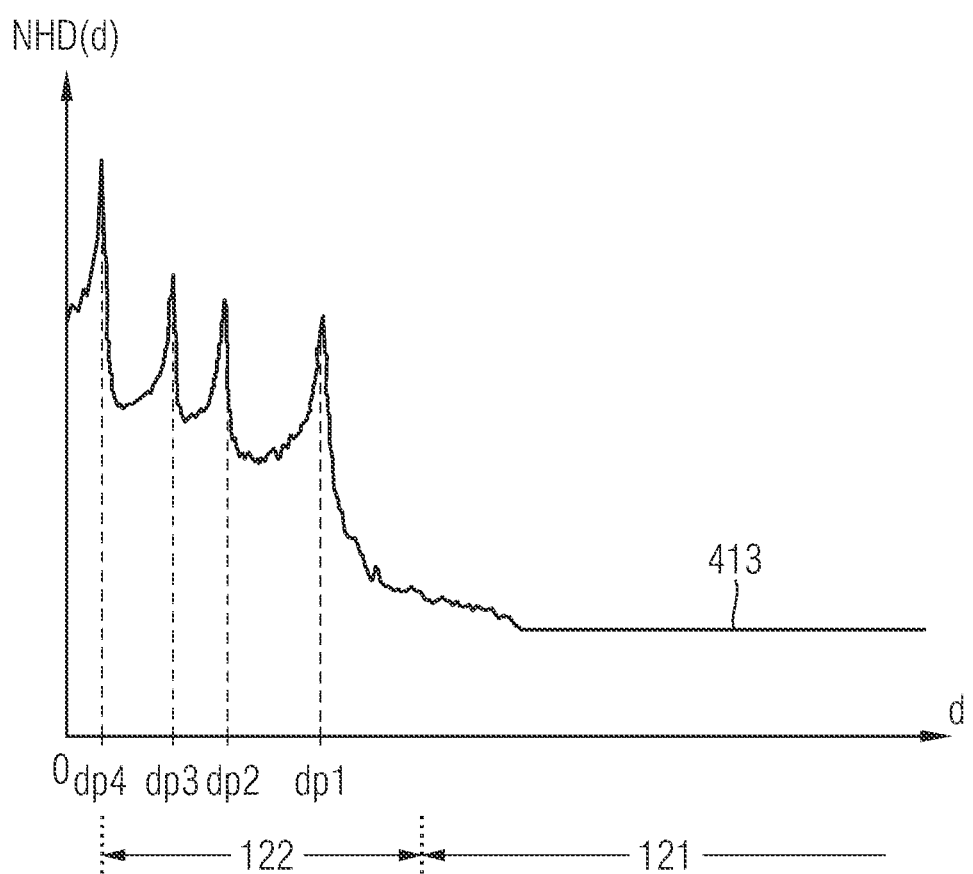

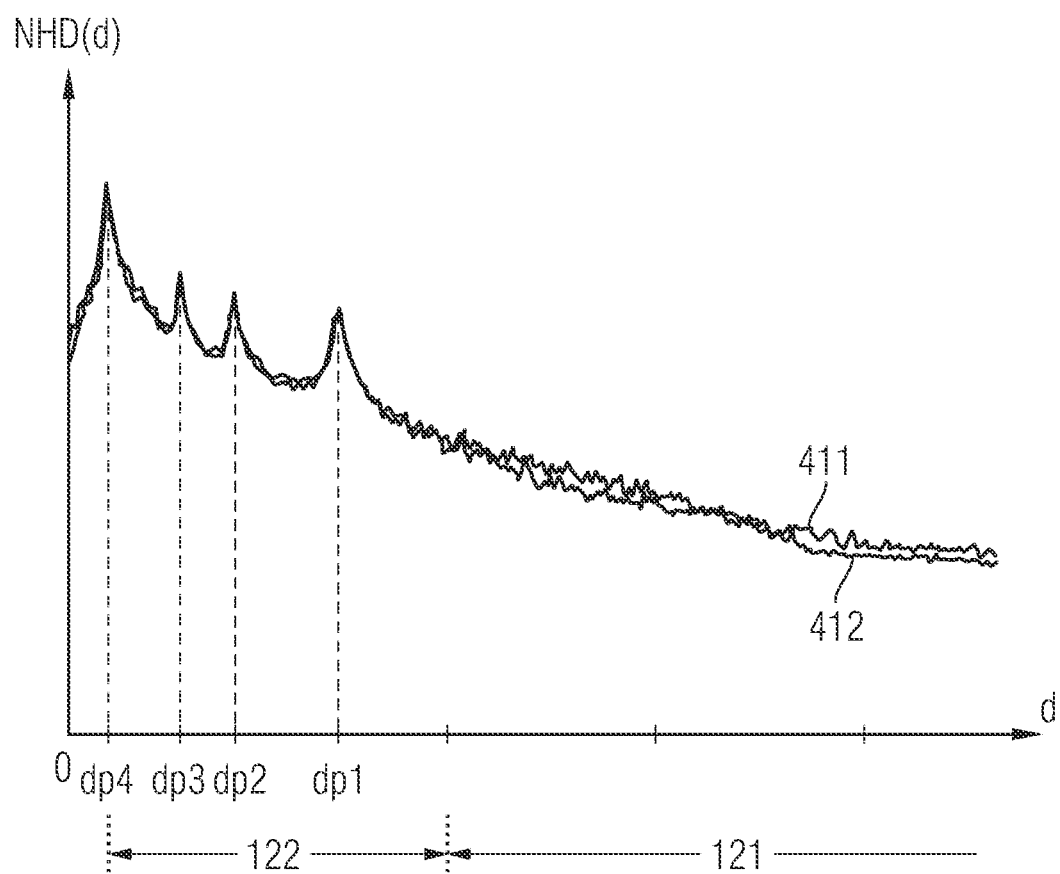

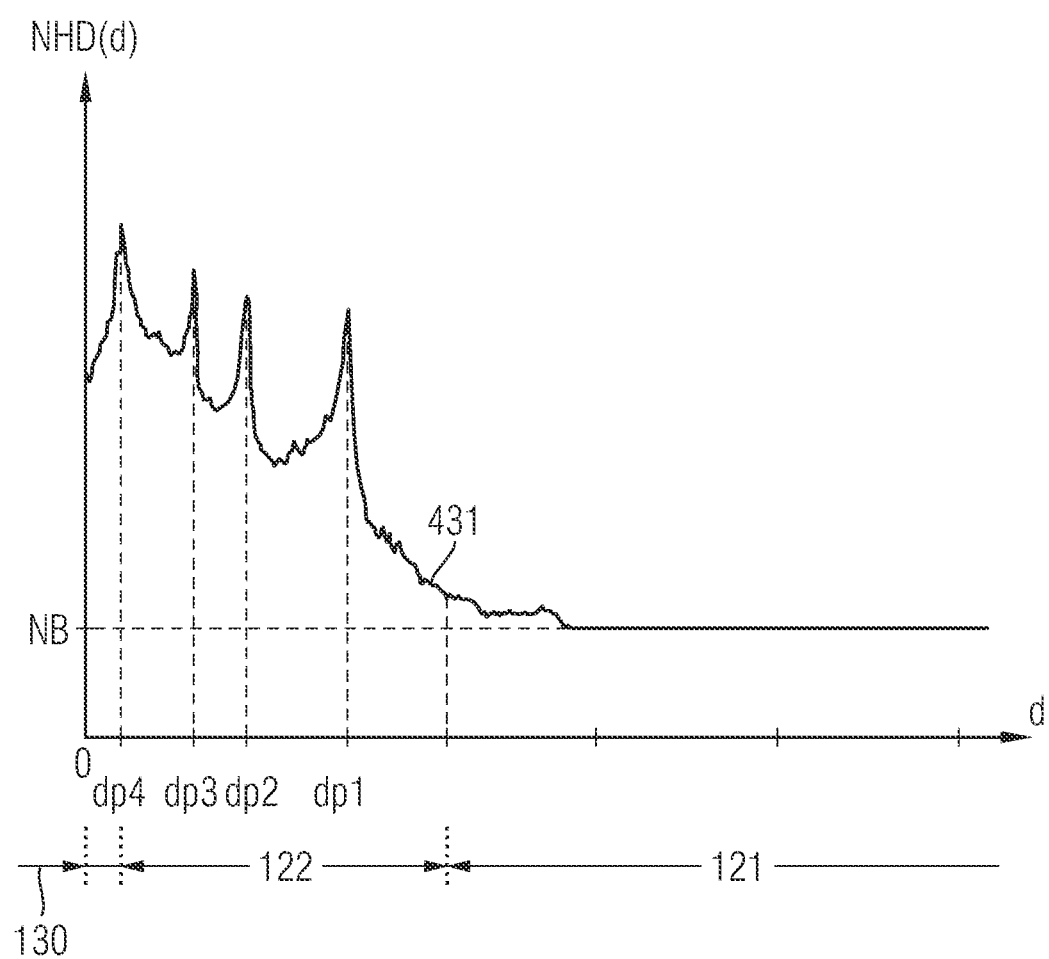

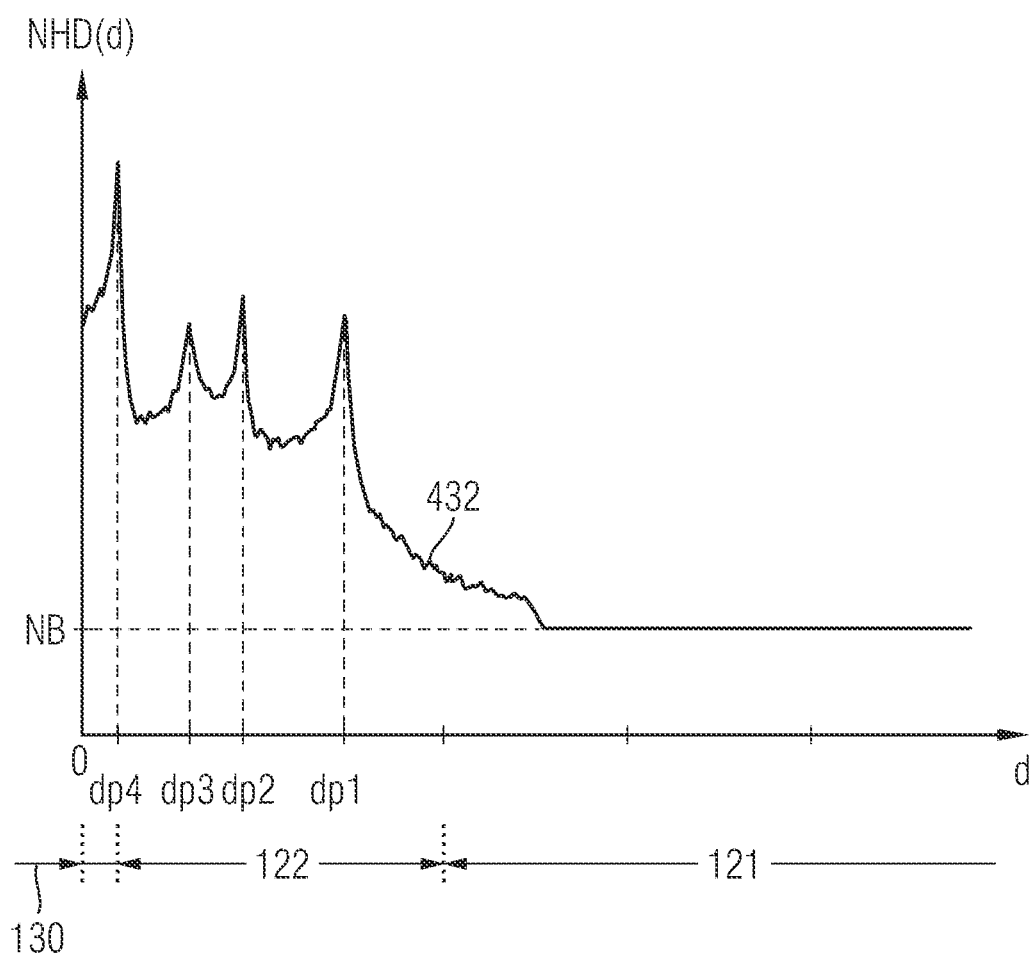

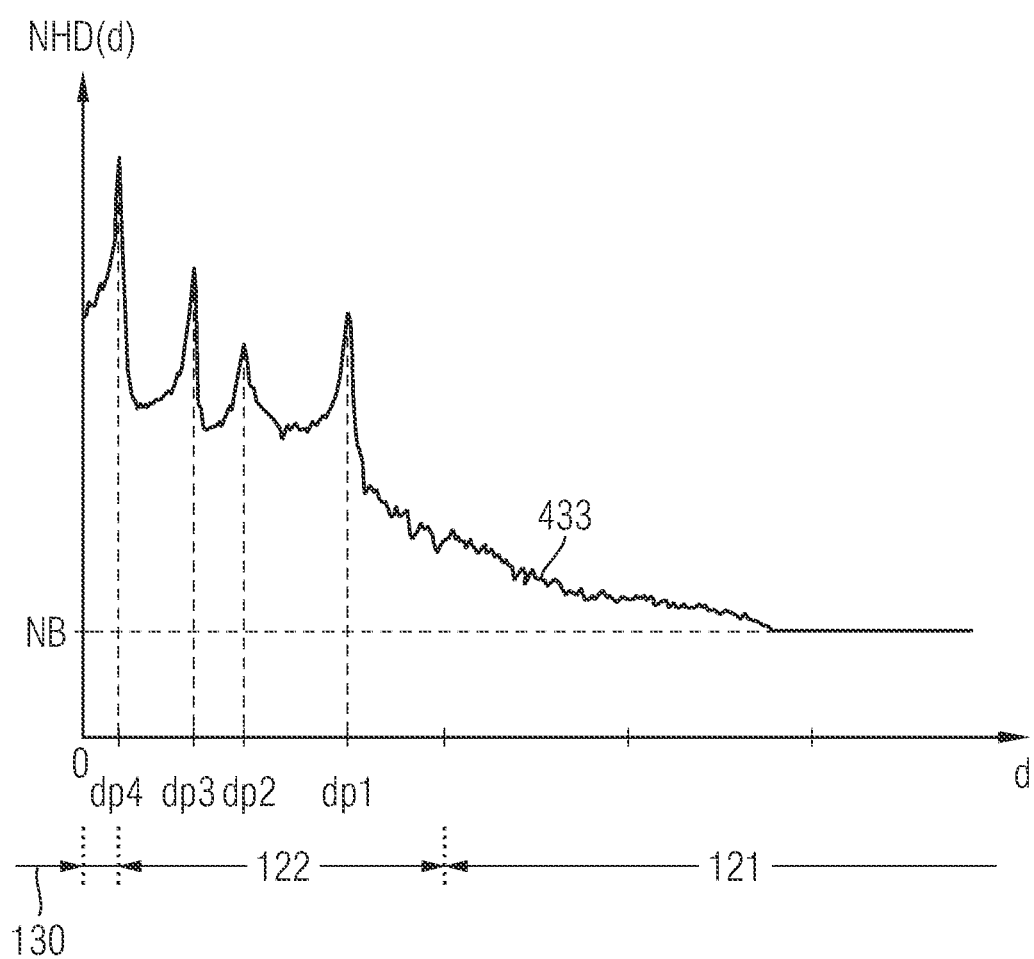

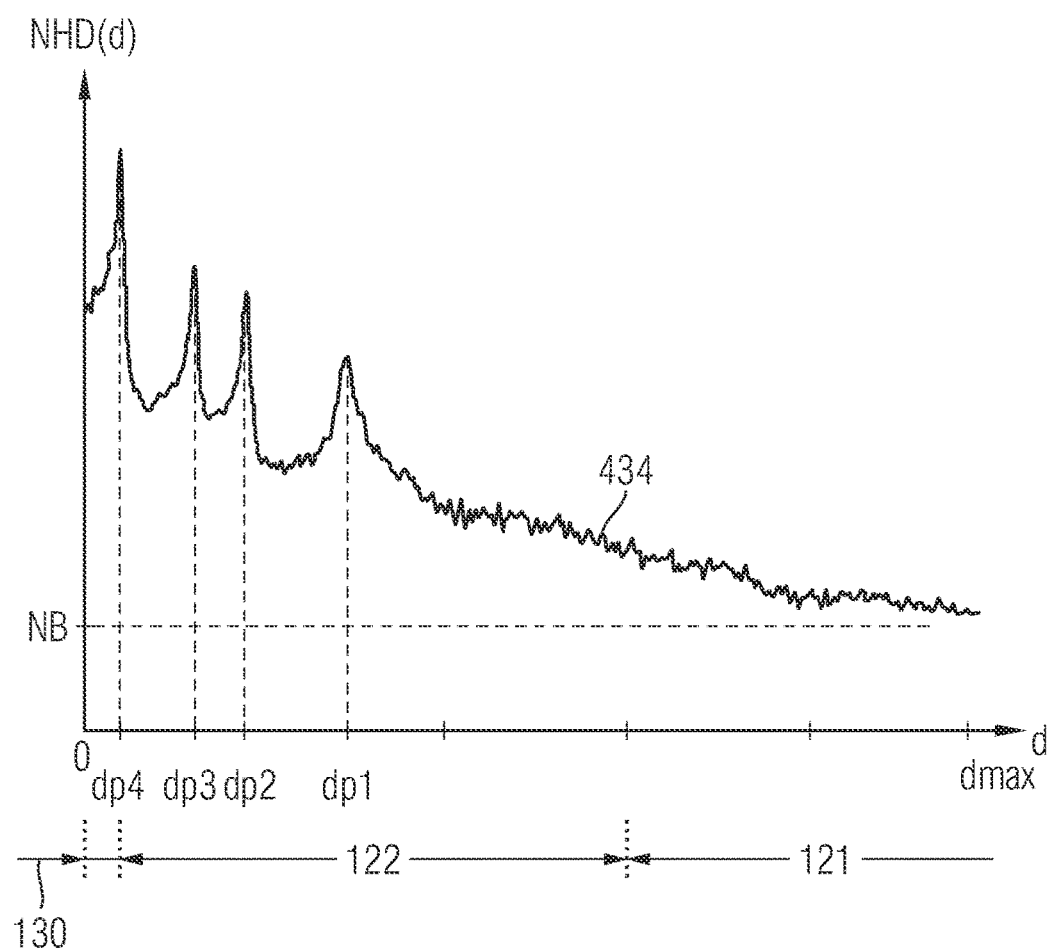

METHOD OF MANUFACTURING SEMICONDUCTOR DEVICES USING LIGHT ION IMPLANTATION AND SEMICONDUCTOR DEVICE

PRIORITY CLAIM

This application claims priority to German Patent Application No. 10 2014 117 538.7 filed on 28 Nov. 2014, the content of said application incorporated herein by reference in its entirety.

BACKGROUND

Rectifying semiconductor devices as well as semiconductor switching elements may be effective as charge carrier source in order to avoid voltage peaks in an electric circuit when the rectifying semiconductor device switches from a forward mode to a blocking mode or when the semiconductor switching element switches from an on-state to an off-state. For example, the wiring of a switching element electrically arranged in a half-bridge circuit forms a parasitic inductance storing magnetic energy as long as the switching element is in the on-state. When the switching element turns off, the parasitic inductance tends to sustain the current flow to dissipate the stored energy. By providing sufficient charge carriers for accommodating the current induced by the parasitic inductance, the turned-off switching element may avoid voltage peaks in the half-bridge circuit.

It is desirable to improve the switching behavior of semiconductor devices.

SUMMARY

According to an embodiment a method of manufacturing a semiconductor device includes forming a first doped region in a single-crystalline semiconductor substrate. Through a process surface light ions are implanted into the semiconductor substrate to generate crystal lattice vacancies between the first doped region and the process surface. A main beam axis of an implant beam used for implanting the light ions deviates by at most 1.5 degree from a main crystal direction along which channeling of the light ions occurs in the semiconductor substrate. Based on the crystal lattice vacancies and hydrogen atoms, a second doped region is formed with a conductivity type opposite to the first doped region.

According to another embodiment a method of manufacturing a semiconductor device includes forming a p doped region in a single-crystalline semiconductor substrate. Through a process surface light ions are implanted into the semiconductor substrate to generate crystal lattice vacancies between the p doped region and the process surface. A main beam axis of an implant beam used for implanting the light ions deviates by at most 1.5 degree from a main crystal direction along which channeling of the light ions occurs in the semiconductor substrate. Hydrogen-related donors are generated at the crystal lattice vacancies to form an n doped region.

According to a further embodiment a semiconductor device includes a p doped region in a single crystalline semiconductor portion and an n doped region between the p doped region and a second surface of the semiconductor portion. The n doped region contains hydrogen-related dopants. A concentration profile of the hydrogen-related dopants along a vertical axis perpendicular to the second surface includes at least a first end-of-range peak. A first dopant concentration at a first distance from the first end-of-range peak in a first vertical direction deviates by not more than one order of magnitude from a second dopant concentration at the first distance from the first end-of-range peak in an opposite second vertical direction (i) between the first end-of-range peak and a local minimum between the first end-of-range peak and a closest neighboring end-of-range peak or (ii), in absence of any further end-of-range peak for hydrogen-related dopants, within half a distance between the first end-of-range peak and the second surface.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1C is a further diagram schematically illustrating a dopant concentration profile including two end-of-range peaks for discussing effects of the embodiments.

FIG. 3A is a schematic diagram illustrating a dopant concentration profile with four end-of-range peaks resulting from four non-channeled light ion implants for discussing effects of the embodiments.

FIG. 3B is a schematic diagram illustrating a dopant concentration profile with four end-of-range peaks resulting from four channeled light ion implants according to an embodiment.

FIG. 5A is a schematic cross-sectional view illustrating an HD (hydrogen-related donor) profile in a portion of any of the semiconductor devices of FIGS. 4A to 4C according to embodiments related to four light ion implants at different acceleration energies, wherein the light ion implant with the highest acceleration energy is performed as channeled implant.

FIG. 5B is a schematic cross-sectional view illustrating an HD profile in a portion of any of the semiconductor devices of FIGS. 4A to 4C according to embodiments related to four light ion implants at different acceleration energies, wherein the light ion implant with the second highest acceleration energy is performed as channeled implant.

FIG. 5C is a schematic cross-sectional view illustrating an HD profile in a portion of any of the semiconductor devices of FIGS. 4A to 4C according to embodiments related to four light ion implants at different acceleration energies, wherein the light ion implant with the third highest acceleration energy is performed as channeled implant.

FIG. 5D is a schematic cross-sectional view illustrating an HD profile in a portion of any of the semiconductor devices of FIGS. 4A to 4C according to embodiments related to four light ion implants at different acceleration energies, wherein the light ion implant with the lowest acceleration energy is performed as channeled implant.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

Figure 1A:
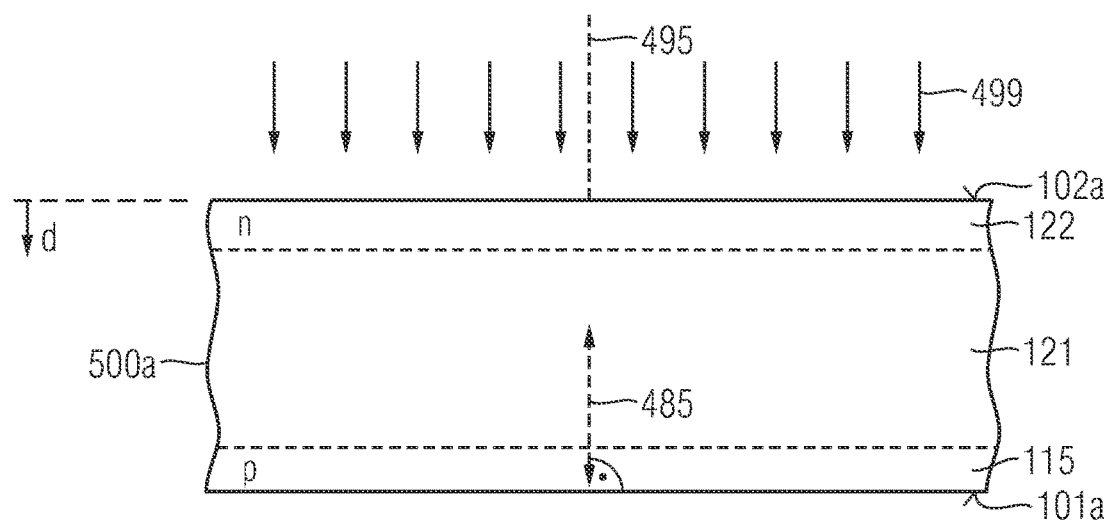
FIG. 1A is a schematic cross-sectional view of a portion of a semiconductor substrate for illustrating a method of manufacturing a semiconductor device according to an embodiment concerning channeled light ion implants.

FIG. 1A shows a portion of a semiconductor substrate 500a for manufacturing a plurality of identical semiconductor devices. A material of the semiconductor substrate 500a is a single crystalline semiconductor material, for example silicon (Si), silicon carbide (SiC), germanium (Ge), a silicon germanium crystal (SiGe), gallium nitride (GaN), gallium arsenide (GaAs) or any other $A_{III}B_V$ semiconductor. According to an embodiment, the semiconductor substrate 500a is a single-crystalline silicon wafer or a single-crystalline silicon carbide wafer with a planar front surface 101a at a front side and a process surface 102a at an opposite rear side. A direction perpendicular to the process surface 102a is a vertical direction and directions parallel to the process surface 102a are horizontal directions.

The semiconductor substrate 500a has a crystal lattice suitable for channeling light ions. Typically, in some crystal directions of single-crystalline materials open spaces extend straight into the crystal. The open spaces form channels through which light ions travel with less interaction with the atoms of the crystal lattice than outside the channels. The channels steer to some degree the light ions, wherein the light ions entering such channels show a deceleration pattern that differs from the deceleration pattern for light ions entering the semiconductor substrate 500a outside the channels. The channel directions coincide with main crystal directions.

At least one first doped region 115 is formed in the semiconductor substrate 500a close to or directly adjoining the front surface 101a. The first doped region 115 may be p doped, e.g., doped with Boron (B) atoms. Light ions 499 such as hydrogen (H), helium (He) or lithium (Li) ions are implanted through the process surface 102a into the semiconductor substrate 500a to form, between the process surface 102a and the first doped region 115, a second doped region 122 with a conductivity type opposite to the first doped region 115. The first and second doped regions 115, 122 may be directly adjacent to each other. According to other embodiments, an intermediate drift zone 121 may form a pn junction with the first doped region 115 and a unipolar homojunction with the second doped region 122.

A maximum tilt angle between a main beam axis 495 of an implant beam directing the light ions 499 to the semiconductor substrate 500a and a main crystal direction 485, along which channeling of the light ions occurs, is at most 1.5 degree, e.g., at most 1.0 degree. The maximum tilt angle between the main beam direction 495 and the main crystal direction 485 along which channeling of light ions occurs as well as an implant beam incidence angle variability of at most ±0.5 degree are valid for at least 80% of the process surface 102a of the semiconductor substrate 500a.

According to an embodiment, the semiconductor substrate 500a has a diamond cubic crystal lattice like silicon (Si). In case of a diamond cubic crystal lattice, the exposed process surface 102a of the semiconductor substrate 500a may coincide with a (100) crystal face, may be tilted to the {100} crystal face by at most ±2 degree or may be any other face suitable for channeling. Accordingly a <100> crystal direction, which is one of several main crystal directions along which channeling occurs, or any other suitable direction, runs perpendicular to the process surface 102a.

Figure 1B:
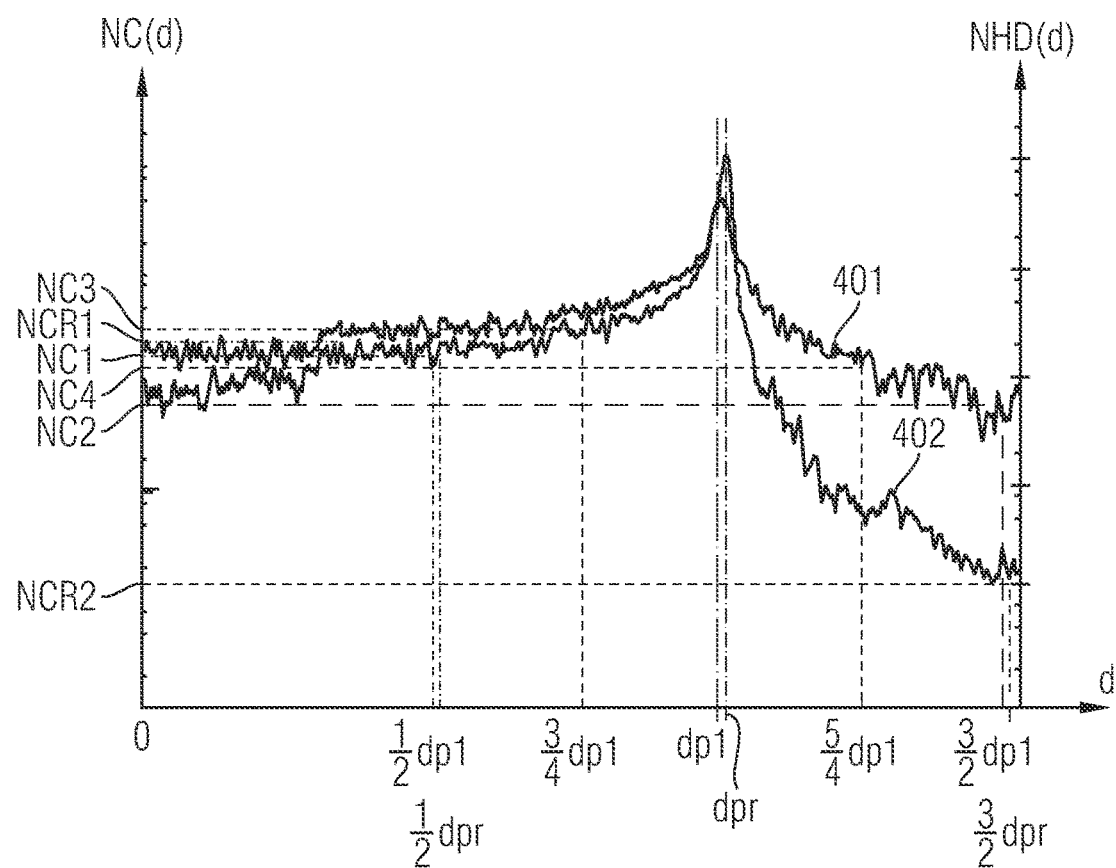
FIG. 1B is a diagram schematically illustrating crystal damage density profiles with one end-of-range peak, respectively, for discussing effects of the embodiments.

FIG. 1B shows the effect of the channeled light ion implant of FIG. 1A. Profiles 401 indicate the crystal damage density NC(d) in the semiconductor substrate 500a of FIG. 1A as a function of a distance d to the process surface 102a for a channeled hydrogen implant at tilt angles of 0, ±0.2, and ±0.5 degree at a logarithmic scale. Profile 402 indicates the crystal damage density NC(d) for a non-channeled hydrogen implant at the same acceleration energy, at a tilt angle of 7 degree and at the same logarithmic scale.

When light ions such as hydrogen ions (protons) are implanted through the process surface 102a at d=0 by an non-channeled implant, most of the light ions finally come to rest at costs of crystal damage, e.g. crystal lattice vacancies, at a peak distance dpr, which is a function of the acceleration energy. Only few light ions penetrate deeper into the crystal lattice such that the crystal damage density NC(d) abruptly decreases beyond the peak distance dpr. In the region traversed by the light ions the density of crystal damages is approximately constant or increases slightly with increasing penetration depth.

The profile 402 for the crystal damage density NC(d) of the non-channeled light ion implant shows a pronounced end-of-range peak at dpr, wherein the peak of the crystal damage density NC(d) is where the light ions come to rest after having finally been decelerated. After tempering at a temperature below a dissociation temperature of HDs (hydrogen-related donors), intrinsic and/or implanted hydrogen atoms decorate the crystal lattice vacancies and form HDs. Since the crystal lattice vacancies do not diffuse, profile 402 qualitatively approximates also the final vertical HD concentration gradient (HD profile) NHD(d) of the non-channeled implant. The long bars at the logarithmic NHD(d) axis correspond to one order of magnitude, respectively.

Profile 401 shows the crystal damage density NC(d) after a channeled light ion implant. Due to the high kinetic energy of the implanted light ions, only a small portion of about ten percent of the light ions enters the crystal lattice through the channels. The rest enters the crystal lattice outside the channels as in case of a non-channeled implant. As a result, a peak distance dp1 indicating the end-of-range peak of the channeled light ions approximately corresponds to the peak distance dpr indicating the end-of-range peak of the non-channeled light ions. The peak value of the end-of-range peak is reduced by an amount in substance corresponding to the portion of channeled light ions, which by destructive interaction with the crystal lattice come to rest only beyond the peak distance dp1. The portion of the implanted light ions entering the channels does not or only to a low degree contribute to crystal damages in the traversed region but penetrate significantly deeper into the semiconductor substrate 500a than non-channeled light ions. As a result, in a region around the end-of-range peak, profile 401 for the channeled implant shows a significantly higher degree of symmetry with respect to the peak distance dp1 than profile 402 for the non-channeled implant with respect to the peak distance dpr.

Channeled light ion implants can be distinguished over non-channeled light ion implants by the higher degree of symmetry around the end-of-range peaks. For example, profile 401 of the crystal damage density NC(d) after the channeled implant of light ions includes an end-of-range peak at the peak distance dp1. For a portion of the semiconductor substrate from 1/2 dp1 to 3/2 dp1 the crystal damage density NC(dp1−Δd) deviates by not more than one order of magnitude from a crystal damage density NC(dp1+Δd) with 0≤Δd≤1/2*dp1. In the illustrated example, NC1 at 1/2*dp1 exceeds NC2 at 3/2*dp1 by a factor less than 5, i.e., by less than 500%.

According to the reference example using a non-channeled light ion implant, within the same range the crystal damage density at NC(dpr−Δd) deviates by more than one order of magnitude from the crystal damage density NC(dpr+Δd) with 0≤Δd≤1/2*dpr. In the illustrated example, NCR1 at 1/2*dpr exceeds NCR2 at 3/2*dpr by a factor greater 100, i.e. by more than two orders of magnitude.

For a range around the end-of-range peak defined by a quarter of the peak distance dp1 from 3/4*dp1 to 5/4*dp1 the crystal damage density NC(d) for a channeled implant for dp1−Δd deviates from the crystal damage density NC(d) for dp1+Δd by at most 500%, while, for the reference example, in an equivalent range the deviation is in the range of one order of magnitude. For example, NC3 at 3/4*dp1 exceeds NC4 at 5/4*dp1 approximately by a factor 2, i.e. by approximately 100%.

The same considerations apply to the concentration NHD(d) of hydrogen-related donors generated by decorating the crystal lattice vacancies with implanted and/or intrinsic hydrogen.

FIG. 1C refers to a HD profile 403 with more than one end-of-range peak. In this case, the region of high symmetry around an end-of-range peak is defined with reference to a local minimum of the smoothed HD profile 403 between the concerned end-of-range peak and the closest neighboring end-of-range peak instead of the half distance between the end-of-range peak and the process surface 102a at d=0. The smoothed HD profile is a low-pass filtered HD profile leaving only one local minimum between two neighboring end-of-range peaks.

HD profile 403 shows a vertical HD density gradient NHD(d) with two end-of range-peaks at dp1 and dp2 and a local minimum of the smoothed HD profile 403 at dm between the neighboring end-of-range peaks, at logarithmic scale. Between dm and (2*dp1−dm) the HD density NHD(dp1−Δd) deviates by not more than one order of magnitude from the HD density NHD(dp1+Δd). For example, in FIG. 1C, ND1 at d=dm and ND2 at d=2*dp1−dm deviate from each other by a factor smaller 2. Within half a distance from dp1−1/2(dp1−dm) to dp1+1/2(dp1−dm) the HD density NHD(dp1−Δd) deviates by not more than 500% from the HD density NHD(dp1+Δd).

In case of an HD profile with three or more end-of-range peaks and an end-of-range peak with two neighboring further end-of-range peaks, the local minimum between the concerned end-of-range peak and the closest one of the two neighboring end-of-range peaks is selected for determining the symmetry and for distinguishing a channeled implant from a non-channeled implant.

Figure 1D:
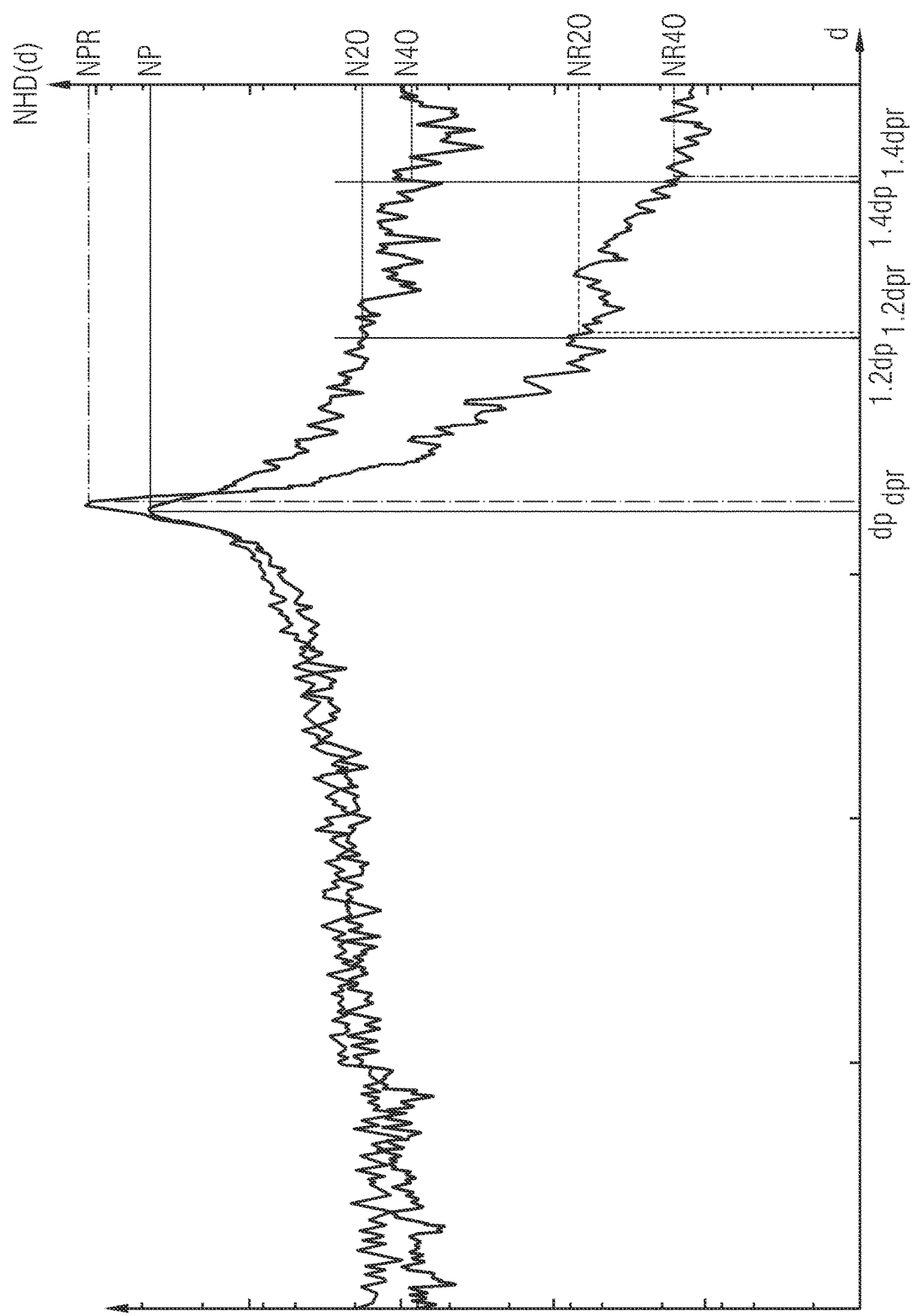
FIG. 1D is a further diagram schematically showing dopant concentration profiles for illustrating effects of the embodiments.

FIG. 1D illustrates a further difference between a first HD density 441 resulting from a channeled implant and a second HD density 442 resulting from a non-channeled implant.

The first HD density 441 has an end-of-range peak with a peak concentration NP at a peak distance dp to the second surface at d=0. Between dp and 1.2*dp the first HD density 441 falls by at most two orders of magnitude. Between dp and 1.4*dp the first HD density 441 falls by at most two and a half orders of magnitude.

The second HD density 442 has an end-of-range peak with a reference peak concentration NPR at a peak distance dpr to the second surface. Between dpr and 1.2*dpr the reference HD density 442 falls by more than three orders of magnitude. Between dpr and 1.4*dpr the reference HD density 442 falls by approximately four orders of magnitude.

Figure 2:
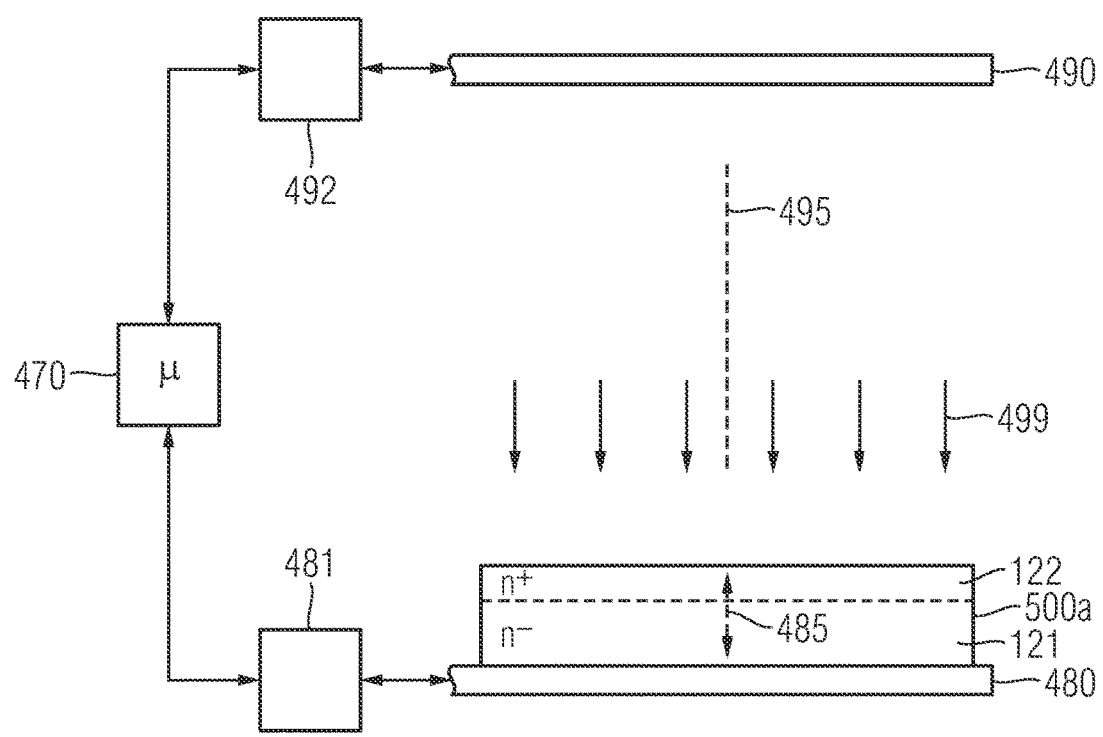
FIG. 2 is a schematic block diagram of an apparatus for performing a method of manufacturing a semiconductor device according to an embodiment.

FIG. 2 refers to an apparatus for performing the above described implant method.

The semiconductor substrate 500a may rest on or may be fixed at a substrate carrier 480. An inclination sensor unit 492 may sense an inclination of the main beam direction 495 of an implant beam with light ions 499 generated by an ion beam source 490 with regard to a reference axis or with regard to the surface of the semiconductor substrate 500a. The inclination sensor unit 492 may transmit information descriptive for the inclination of the main beam direction 495 to the controller 470 or directly to an actuator unit 481. The actuator unit 481 may adjust the inclination of the substrate carrier 480 or the semiconductor substrate 500a in response to signals received from the controller 470 or the inclination sensor unit 492.

The total incident angle variability of the ion beam with respect to the main beam direction 495 or with respect to the semiconductor substrate 500a is at most 0.5 degree, for example at most 0.3 degree.

The conditions concerning the main beam incidence angle variability are fulfilled for at least 80% of the surface of the semiconductor substrate 500a. According to an embodiment the conditions concerning the main beam incidence angle variability are fulfilled for at least 90% of the surface of the semiconductor substrate 500a.

Using the inclination sensor unit 492 and the actuator unit 481, the semiconductor substrate 500a is aligned to the main beam direction 495 such that the main beam direction 495 at least approximately coincides with the main crystal direction 485, at a deviation between the main beam direction 495 and the main crystal direction 485 of at most ±2 degree. According to an embodiment, the deviation between the main crystal direction 485 selected for channeling and the main beam direction 495 is less than 1.0 degree, e.g., 0 degree.

FIGS. 3A and 3B refer to the application of channeled light ion implants for the formation of multi-implanted field stop layers.

FIG. 3A shows a HD profile 413 of a multi-implanted field stop layer 122 of a power semiconductor diode or an PT-IGBT (punch-through IGBT) based on four non-channeled light ion implants at an implant angle of 7 degree. The HD profile 413 sharply decreases beyond each of the end-of-range peaks at peak distances dp4, dp3, dp2 and dp1.

FIG. 3B shows doping profiles 411, 412 of the power semiconductor diode or PT-IGBT using channeled light ion implants at an implant angle of 0 degree (profile 411) and 0.2 degree (profile 412). Due to the symmetry around the end-of-range peak at dp4, dp3, dp2 and dp1, a pedestal density of hydrogen-related donors decreases more gradually and the end-of-range peaks projecting in a less pronounced manner from the pedestal density.

When, e.g., a PT-IGBT turns off, a depletion zone accommodating the blocking voltage gradually expands starting from a pn junction between body zones of IGFET cells and a drift zone 121 at the right side of the diagram in FIG. 3B. A buffer or field stop zone 122 avoids that the depletion zone and the electric field in the gradually expanding depletion zone reach an electrode at d=0 at the rear side. When the electric field expands into the direction of the rear side, the semiconductor device can supply charge carriers from a substrate portion between the depletion zone and the rear side for supporting an external current flow.

When dopant atoms such as arsenic or phosphorous atoms are used as dopants in the field stop zone 122, the diffusion of the dopant atoms results in smooth, Gaussian-like dopant profiles. Since the number of mobile charge carriers is high, where the number of stationary charge carriers such as dopant atoms is low and vice versa, with expanding depletion zone the number of free charge carriers available for sustaining an external current increases steadily and the snappiness of such PT-IGBTs is low. However, outdiffusion of dopant atoms implanted from a rear side requires a thermal budget which may damage structures and dopant gradients in previously formed doped zones on the front side of the PT-IGBT.

Alternatively, the field stop zones 122 may be formed by generating HDs after completion of processing at the front side. Conventional light ion implants from the rear side, however, show steep HD profile transitions on the side of the drift zone 121 and/or multiple pronounced peaks deteriorating the switching behavior. Only a significant number of implants at different acceleration energies may smooth such HD profiles sufficiently.

Instead, only few channeled light ion implants provide a more gradual increase of the dopant concentration, such that the semiconductor device can gradually dissipate the electric field at an early point in time after the switching process has been triggered. At the same total thickness of the semiconductor device and at the same number of implants, the channeled light ion implants improve the snappiness of the semiconductor device since the depletion zone can gradually expand in a smooth, less abrupt manner. The charge carriers outside the expanding depletion zone are continuously available for supplying a current induced by external circuit elements.

Channeled light ion implantation allows combining a gradual transition of effective dopant concentrations between drift zone 121 and wafer rear side with a formation of the buffer or field stop zones 122 from the rear side of the semiconductor devices at a late process stage. Compared to approaches approximating a gradual field concentration profile for the field stop zones 122 with non-channeled implants, the embodiments get by with a lower number of implants for achieving a comparable or even better effect.

Figure 4A:
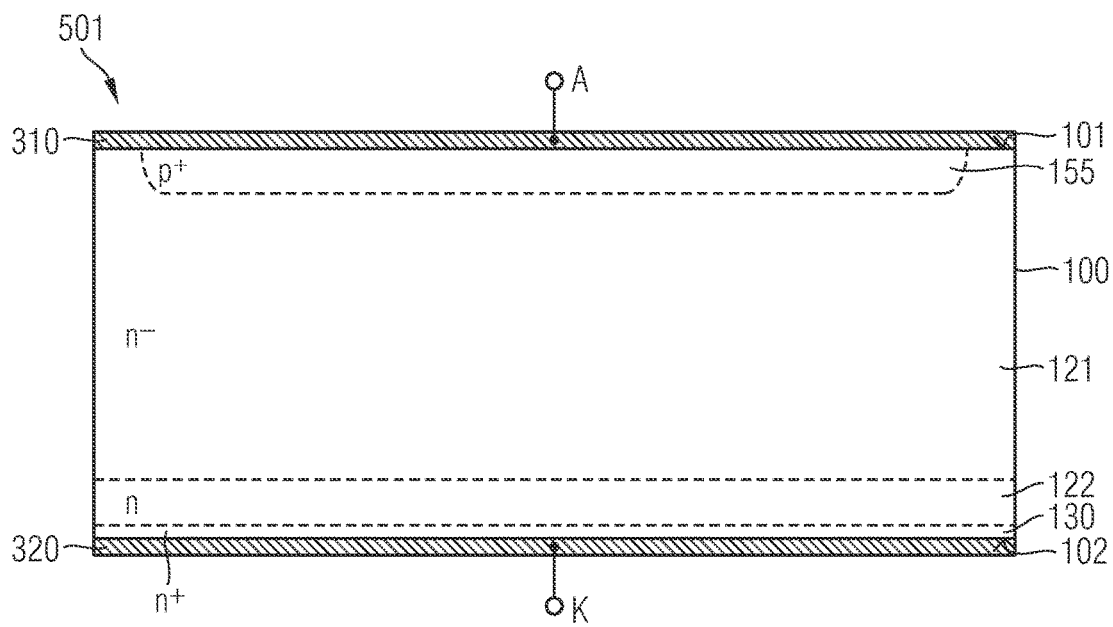
FIG. 4A is a schematic cross-sectional view of a power semiconductor diode according to an embodiment.

FIG. 4A illustrates a power semiconductor diode 501 with a nominal forward current $I_F$ greater 1000 mA, e.g., greater 10 A or greater 100 A.

A single crystalline semiconductor material, e.g. silicon, forms a semiconductor portion 100 with a planar first surface 101 at a front side as well as a planar second surface 102 parallel to the first surface 101 at a rear side opposite to the front side.

A minimum distance between the first and second surfaces 101, 102 depends on the voltage blocking capability, the power semiconductor diode 501 is specified for. For example, the distance between the first and second surfaces 101, 102 may be in a range from 90 µm to 200 µm when the semiconductor diode 501 is specified for a blocking voltage of about 1200 V. Other embodiments related to semiconductor devices with higher blocking capabilities may provide semiconductor portions 100 with a thickness of several 100 µm. Semiconductor portions 100 of semiconductor devices with lower blocking capabilities may have a thickness of 25 µm to 90 µm.

In a plane parallel to the first surface 101 the semiconductor portion 100 may have a rectangular shape with an edge length in the range of several millimeters or a circular shape with a diameter of several centimeters. Directions parallel to the first surface 101 are horizontal directions and directions perpendicular to the first surface 101 are vertical directions.

The semiconductor portion 100 includes a first doped region 115 forming an ohmic contact with a first load electrode 310 at the front side. The first load electrode 310 forms or is electrically connected to an anode terminal A.

A heavily doped contact layer 130 forms an ohmic contact with a second load electrode 320 at the rear side. The second load electrode 320 forms or is electrically connected to a cathode terminal K. The semiconductor portion 100 further includes a weakly doped drift region 121 forming a pn junction with the first doped region 115. An effective dopant concentration in the drift region 121 may be at least 1E12 $cm^{-3}$ and at most 1E17 $cm^{-3}$. The doping in the drift region 121 may correspond to an initial background doping in the semiconductor portion 100. A field stop zone 122 separates the contact layer 130 and the drift region 121 and forms unipolar homojunctions with the contact layer 130 and the drift region 121. The field stop zone 122 includes HDs based on a channeled implant of light ions, e.g. protons. A concentration profile of the HDs may include one, two or more end-of-range peaks, wherein the peak values of the end-of-range peaks may decrease with increasing distance to the second surface 102.

Figure 4B:
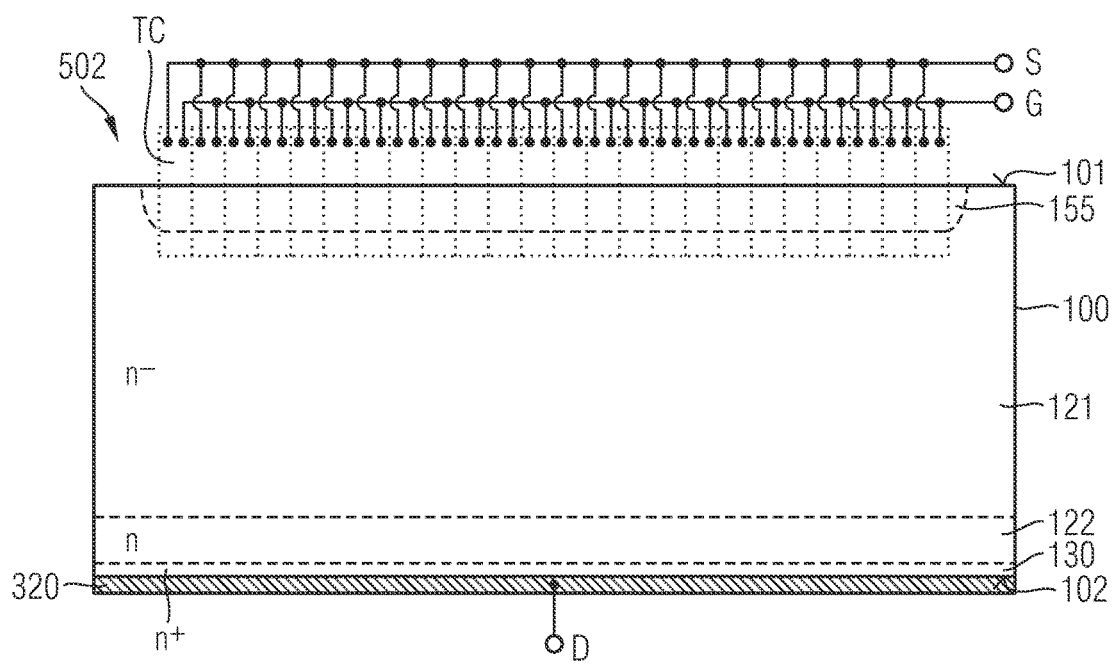
FIG. 4B is a schematic cross-sectional view of an IGFET (insulated gate field effect transistor) according to another embodiment.

FIG. 4B refers to an IGFET 502. As regards details of the semiconductor portion 100, the drift zone 121, the field stop zone 122 and the contact layer 130 reference is made to the description of FIG. 4A. The IGFET 502 includes transistor cells TC, which may be IGFET cells with n conductive source zones and with portions of the first doped region 115 forming body zones of the transistor cells TC. The body zones separate the source zones from the drift zone 121, respectively. The source zones may be electrically connected or coupled to a first load electrode at the front side. The first load electrode may form or may be electrically connected to a source terminal S.

Gate electrodes of the transistor cells TC may be electrically connected or coupled to a gate terminal G and may be capacitively coupled to the body zones through gate dielectrics. Subject to a voltage applied to the gate terminal G, inversion channels are formed in the body zones and provide an electron flow through the transistor cells TC such that in an on-state of the IGFET 502 electrons enter the drift zone 121 through the transistor cells TC.

The transistor cells TC may be planar cells with lateral gate structures arranged outside the contour of the semiconductor portion 100 or trench cells with trench gate structures extending from the first surface 101 into the semiconductor portion 100. For example, the source and body zones of the transistor cells TC may be formed in semiconductor mesas separated by the trench gate structures.

Figure 4C:
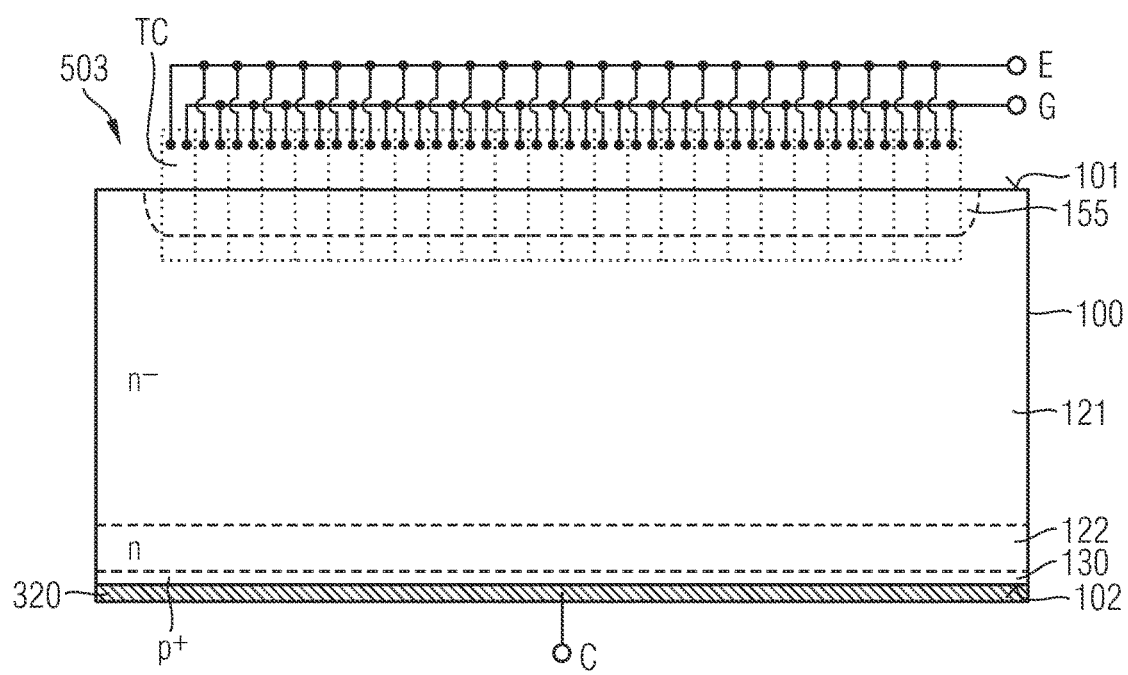
FIG. 4C is a schematic cross-sectional view of an IGBT (insulated gate bipolar transistor) according to a further embodiment.

FIG. 4C refers to an IGBT 503, for example an PT-IGBT with a p-type contact layer 130 and the second load electrode 320 electrically connected to a collector terminal C. The source and body zones are electrically connected or coupled to an emitter terminal E. For further details, reference is made to the description of the semiconductor diode 501 of FIG. 4A and the IGFET 502 of FIG. 4B.

The formation of the field stop zones 122 of the semiconductor devices 501, 502, 503 of FIGS. 4A to 4C includes at least one channeled light ion implant from the wafer rear side. The field stop zones 122 may be formed by a plurality of channeled light ion implants or by a combination of one or more channeled light ion implants with one or more non-channeled light ion implants.

For example, any of the following vertical density gradients for hydrogen-related donors can be combined with any of the semiconductor diode 501, IGFET 502 and IGBT 503 of FIGS. 4A to 4C.

In FIGS. 5A to 5D four light ion implants at different acceleration energies define the vertical extension of a field stop zone 122. The dose of the light ion implants may decrease with increasing acceleration energy to approximate a steady increase of NHD(d) into the direction of the second surface at d=0. A pedestal portion of the HD density NHD(d) in the field stop zone 122 gradually decreases from the interface to the contact layer 130 to the interface with the drift zone 121. The end-of-range peaks protrude from the pedestal portion at the peak distances dp4, dp3, dp2, dp1. At least a portion of the drift zone 121 may have a uniform background dopant concentration NB. The gradually decreasing pedestal portion supports the continuously increasing availability of free charge carriers during the change to a blocking state. Pronounced end-of-range peaks may contribute to discontinuities in the switching behavior.

In FIG. 5A the implant with the lowest dose and at the lowest acceleration energy at peak distance dp4 is performed as channeled implant, while the implants at peak distances dp3, dp2 and dp1 are non-channeled implants. The high dose of the channeled implant results in a steady decrease of a pedestal density of the HD profile 431 beyond dp1.

In the HD profile 432 of FIG. 5B the implant at peak distance dp3 with the third highest acceleration energy is a channeled implant while the implants at peak distances dp4, dp2 and dp1 are non-channeled implants.

In FIG. 5C the implant with the second highest acceleration energy at peak distance dp2 is a channeled implant, while the implants corresponding to peak distances dp4, dp3 and dp1 are non-channeled implants. Shifting the channeled implant to higher acceleration energies may support a smoother transition of the resulting HD profile 433 between the drift zone 121 and the deepest end-of-range peak dp1 in the field stop zone 122.

In FIG. 5D HD profile 434 results from one channeled implant at the highest acceleration energy corresponding to peak distance dp1. Further implants with acceleration energies corresponding to peak distances dp2, dp3 and dp4 are non-channeled implants. The HD profile 434 exhibits a long, smooth transition between the dopant concentration NB in the drift zone 121 and the first end-of-range peak at peak distance dp1 in the field stop zone 122. The transition may extend deep into a drift zone 121, for example up to at least a third of a distance between the first end-of-range peak and a p doped region forming a pn junction with the drift zone 121 and formed between the drift zone 121 and a first surface at d=dmax. The implant angle of the channeled implant is at least 3.5 degree, e.g., at least 5 degree, for example 7 degree with respect to the first surface.

Figure 6A:
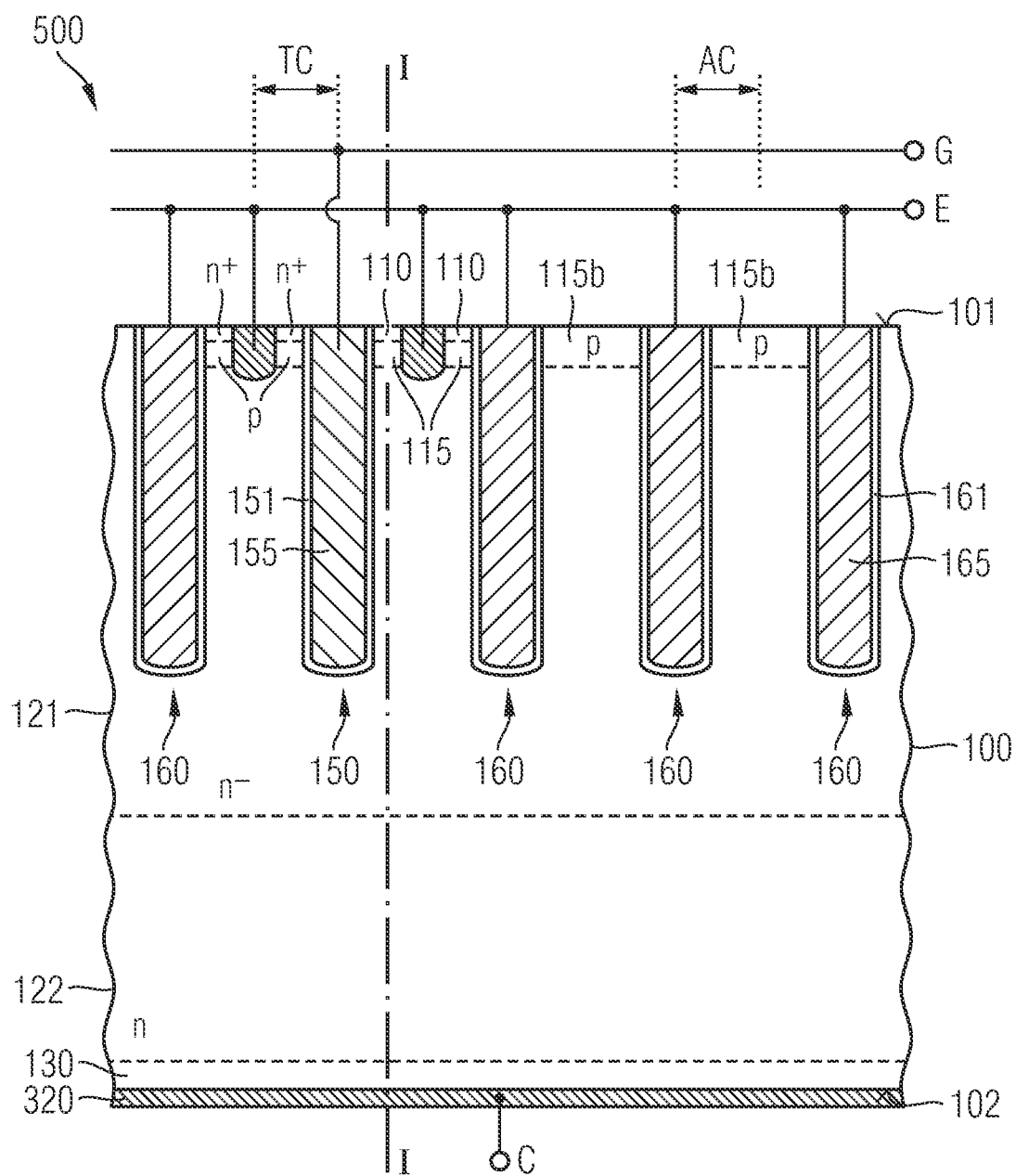
FIG. 6A is a schematic cross-sectional view of a portion of a semiconductor device according to an embodiment related to the formation of drift zones by using light ion implants.
Figure 6B:
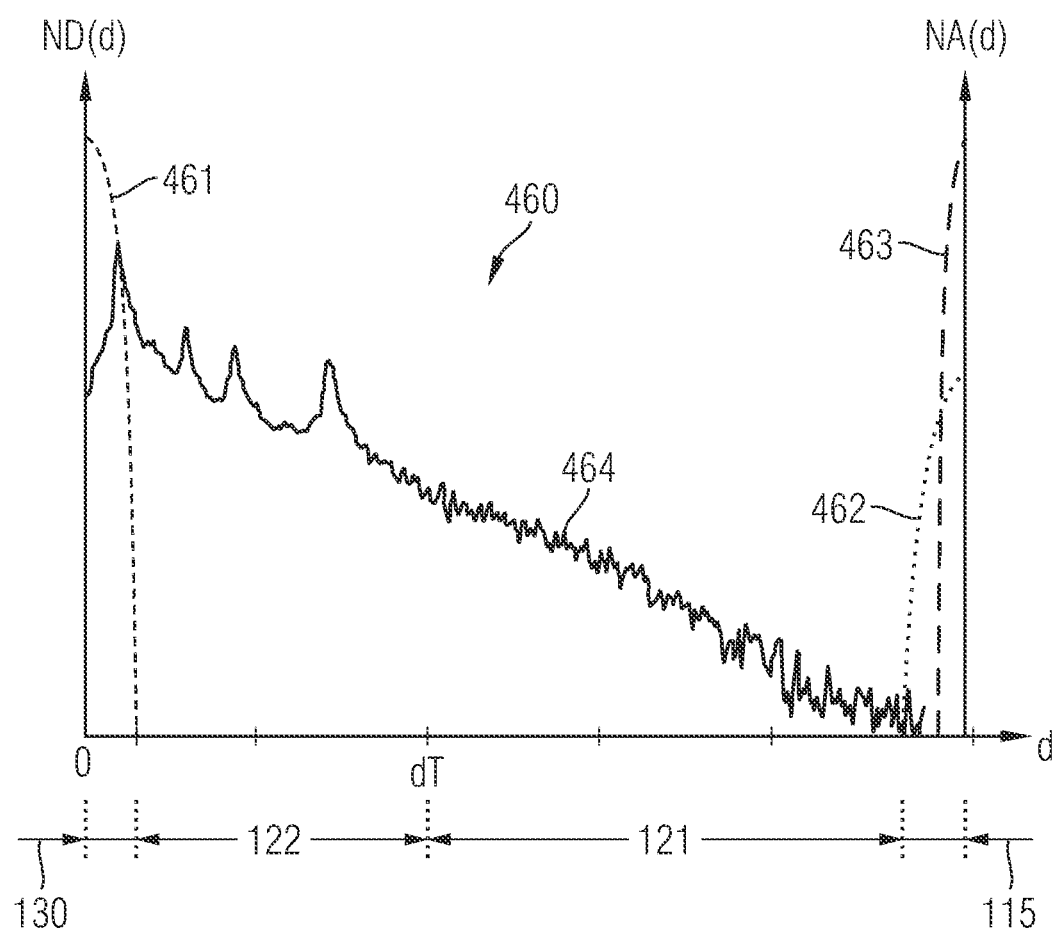
FIG. 6B is a schematic diagram illustrating the HD profile in the semiconductor device of FIG. 6A according to an embodiment concerning the use of light ions in drift zones.
Figure 6C:
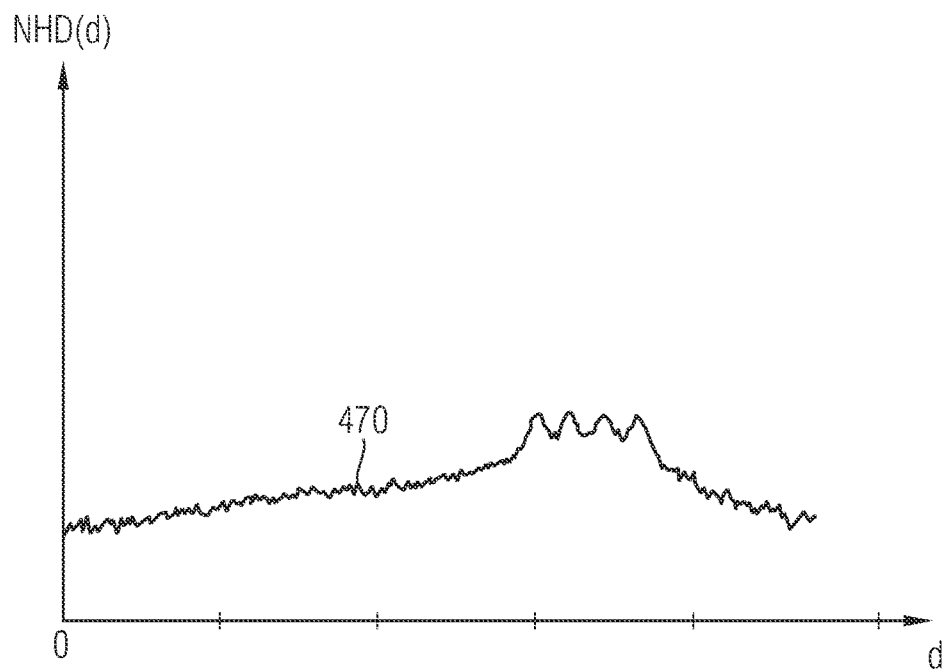
FIG. 6C is a schematic diagram illustrating the HD profile in the semiconductor device of FIG. 6A according to a further embodiment concerning the use of light ions for drift zones with bulgy HD profiles.

FIGS. 6A to 6C refer to semiconductor devices 500 which drift zones 121 are at least partially formed by using channeled light ion implants. The illustrated embodiment refers to a semiconductor device 500 with transistor cells TC and a drift zone 121, wherein an effective dopant profile in the drift zone 121 is modulated by channeled light ion implants. Other embodiments may refer to semiconductor devices 500 without any transistor cells TC.

The semiconductor device 500, which may be an IGFET, an IGBT or an MGD (MOS gated diode), includes a semiconductor portion 100 with IGFET cells TC formed along a first surface 101 at the front side. A heavily p or n doped contact layer 130 is formed along a second surface 102 at the rear side opposite to the front side. Each transistor cell TC includes a gate structure 150 with a conductive gate electrode 155 that may include or consist of a heavily doped polycrystalline silicon layer and/or a metal containing layer. The gate structure 150 may be a trench gate extending from the first surface 101 into the semiconductor portion 100. The gate electrode 155 is completely insulated against the semiconductor portion 100. A gate dielectric 151 separates the gate electrode 155 at least from the body zones 115. The gate dielectric 151 capacitively couples the gate electrode 155 to channel portions in the body zones 115. The gate dielectric 151 may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof.

When a voltage applied to the gate electrode 150 exceeds a preset threshold voltage, electrons accumulate in the channel portions of the body zones 115 and form inversion channels that make the pn junction between the drift zone 121 and the body zones 115 permeable for electrons.

In addition to the transistor cells TC, the semiconductor device 500 may include auxiliary cells AC, which may be diode cells for RC-IGBTs (reverse conducting IGBTs), desaturation cells for decreasing a charge carrier plasma density in the semiconductor portion 100 before switching off the transistor cells TC and/or enhancement cells increasing the charge carrier plasma density in a sub period of an on-state of the IGFET cells TC. The auxiliary cells AC may include field electrode structures 160 with a field electrode 165 that may be electrically connected to an emitter terminal E and a field dielectric 161 insulating the field electrode 165 from the material of the semiconductor portion 100. For further details reference is made to the description of the previous figures.

The effective dopant concentration in the drift zone 121 results at least in parts from one or more channeled light ion implants from the back of the wafer, wherein the drift zone 121 may have or may not have an initial n-type background doping resulting from donor atoms, oxygen-related dopants and/or HDs. The initial background doping may be lower than 1E14 cm$^{-3}$ and can be between 1% and 80% of the final doping level. Alternatively, a lowly doped p-type doping can be provided prior to the generation of the n-type doping by light ions.

FIG. 6B shows a vertical dopant profile 460 of the semiconductor device 500 of FIG. 6A along line I-I.

A first profile portion 461 represents the heavily doped p-doped or n-doped contact layer 130 along the second surface 102 at d=0. The dopant concentration in the contact layer 130 is sufficiently high to ensure an ohmic contact with the second load electrode 320.

A second profile portion 462 corresponds to the body zones 115. Along the first surface 101, a third profile portion 463 indicates the heavily n-doped source zones 110. A fourth profile portion 464 results from four channeled implants of protons and form a more heavily doped field stop zone 122 and at least a portion of a lower doped drift zone 121. An interface between the field stop zone 122 and the drift zone 121 may be defined at a distance dT from the second surface 102 at which an effective dopant concentration in the drift zone 122 is below a predefined value of, e.g., 5E13 cm$^{-3}$.

Using at least one channeled implant a base doping in the drift zone 121 may be adjusted. For example, the concentration of hydrogen-related donors at a distance to the second surface 102, which is at least 150%, e.g., at least 200% of a peak distance of that end-of-range peak of hydrogen-related donors, which is closest to the pn junctions between the body zones 115 and the drift zone 121, is at least 150%, e.g., at least 200% of a concentration of hydrogen-related donors at the pn junction. The distance between the body zones 115 and the second surface 102 may be between 50 µm and 500 µm, e.g., between 80 µm and 200 µm, and the distance between the end-of-range peak of hydrogen-related donors closest to the pn junction and the second surface 102 may be in a range from 20 µm to 40 µm, by way of example.

The same considerations apply to power semiconductor diodes without transistor cells, with an anode zone instead of the body zones 115.

Providing the drift zone dopant profile according to the embodiment gets along without proton implant at acceleration energies beyond a threshold energy of 2.6 MeV, which may result in a critical neutron radiation in view of legal requirements for nuclear technical installations.

Since after the implant the hydrogen atoms are approximately at the necessary location for forming the HDs, a tempering of the implant can be performed at temperatures at or below 400 degree Celsius, such that the formation of oxygen-induced thermal donors can be suppressed to a high degree. At low formation rates for thermal donors, an impact of fluctuations of an oxygen concentration from semiconductor substrate to semiconductor substrate or within a semiconductor substrate on device characteristics may be reduced compared to methods including a tempering at temperatures above 400 degree inducing the formation of thermal donors. Furthermore, the annealing at moderate temperatures at or below approx. 400° C. makes this process compatible to BEOL (back end of line) processes and, hence, facilitates its introduction into the process flow. In addition, the method gets by without a high energy implant from the front side, which may damage a previously formed gate dielectric 151. In this way, the channeled implant from the rear side increases the reliability of the gate dielectric.

By appropriately selecting acceleration energy, implant dose and the temperature gradient for the tempering following the implant, the fourth profile portion 464 may be tuned to generate a trapezoid field profile in the blocking state, thereby improving the softness of the semiconductor device 500 during switching and at the same time increasing the blocking capability and radiation ruggedness. A stationary positive space charge, which in a short-circuit condition at least partially compensates for the short-circuit induced electron current, supports a wider expansion of the depletion zone and reduces the maximum field strength occurring during the short-circuit condition.

According to another embodiment, the channeled light ion implant may compensate for fluctuations of the background doping of the semiconductor substrate 500.

According to embodiments related to oxygen-rich and/or carbon-rich semiconductor portions 100, the crystal damage generated by the channeling effect in the drift zone 121 is used to increase the generation rate for oxygen-related thermal donors (OTDs) in order to achieve a higher background doping in the drift zone 122 or to achieve the same background doping at a low thermal budget and/or at a lower implant dose.

In case the semiconductor device 500 is an IGFET the dopant gradient in the drift zone 121 as illustrated significantly decreases the on-state resistance RDSon without or with low negative impact on the voltage blocking capability.

FIG. 6C refers to a doping profile 470 using the symmetry of one or channeled implants to adjust a base doping of the semiconductor device 500. One or more channeled light ion implants may be used to increase the effective dopant concentration in the vertical center of the drift zone 121. The method provides bulgy dopant profiles 470 in a simpler and more cost effective way than, for example, implanting dopant atoms at high energy. Bulgy dopant profiles enable a softer switching behavior of power devices.

Buried channeling profiles of the type of or similar to the doping profile 470 shown in FIG. 6C may be combined with channeling or non-channeling buffer or field stop profiles of the type of or similar to the HD profiles 411, 412, 413, shown in FIGS. 3A and 3B.

Figure 7:
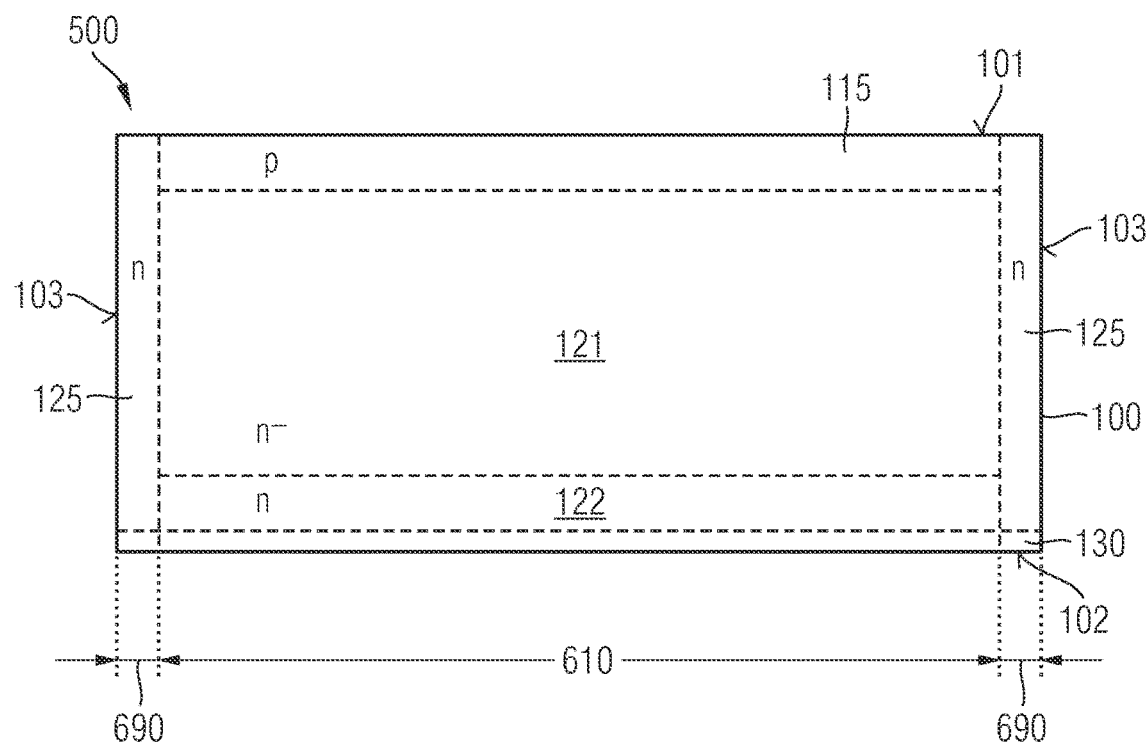
FIG. 7 is a schematic cross-sectional view of a portion of a semiconductor device according to an embodiment related to a lateral variation of a channeled light ion implant.

FIG. 7 shows a semiconductor device 500 according to an embodiment related to laterally varying hydrogen-related dopant concentration profiles. An implant mask may be formed prior to a channeled implant, wherein the implant mask covers first portions and exposes second portions on a front side or a rear side of a semiconductor substrate from which the semiconductor device is obtained. The implant mask may shadow the covered portions against the implant beam or may scatter the implant beam off from a channeling axis, such that the implant is channeled in the exposed portions and non-channeled in the covered portions.

For example, the semiconductor device 500 may include an active area 610 of a semiconductor portion 100, wherein the active area 610 includes structures defining the functionality of the semiconductor device 500, which may be or may contain a power semiconductor diode, an IGBT, an IGFET or an MGD. The active area 610 may be configured according to any of the semiconductor diode 501, the IGFET 502 and the IGBT 503 of FIGS. 4A to 4C. An edge area 690 directly adjoining a lateral surface 103 of the semiconductor portion 100 surrounds the active area 610.

An implant mask may be used, e.g., at the rear side such that at least one of the edge area 690 and the active area 610 contains hydrogen-related dopants resulting from a channeled light ion implant with higher symmetry of the end-of-range peaks than for non-channeled light ions implants. In case both the edge area 690 and the active area 610 contain hydrogen-related dopants, a vertical concentration profile of the hydrogen-related dopants in the edge area 690 differs from a vertical concentration profile of the hydrogen-related dopants in the active area 610. The implant mask may be used in a sense only to scatter the implanted ions off the channeling direction, thus reducing the fraction of the channeled ions locally but not blocking the implant.

According to an embodiment a vertical HD profile in a drift zone 121 in the active area 610 differs from a vertical HD profile in a corresponding portion of the edge area 690.

According to another embodiment a vertical HD profile in a field stop zone 122 in the active area 610 differs from a vertical HD profile in a corresponding portion in the edge area 690.

According to a further embodiment a base doping of the semiconductor portion 100 in the active area 610 may differ from a base doping in the edge area 690. For example, a base doping in the edge area 690 may be lower than in the cell area 610 to improve the blocking capability of the edge area 690 without significantly reducing switching softness.

Figure 8A:
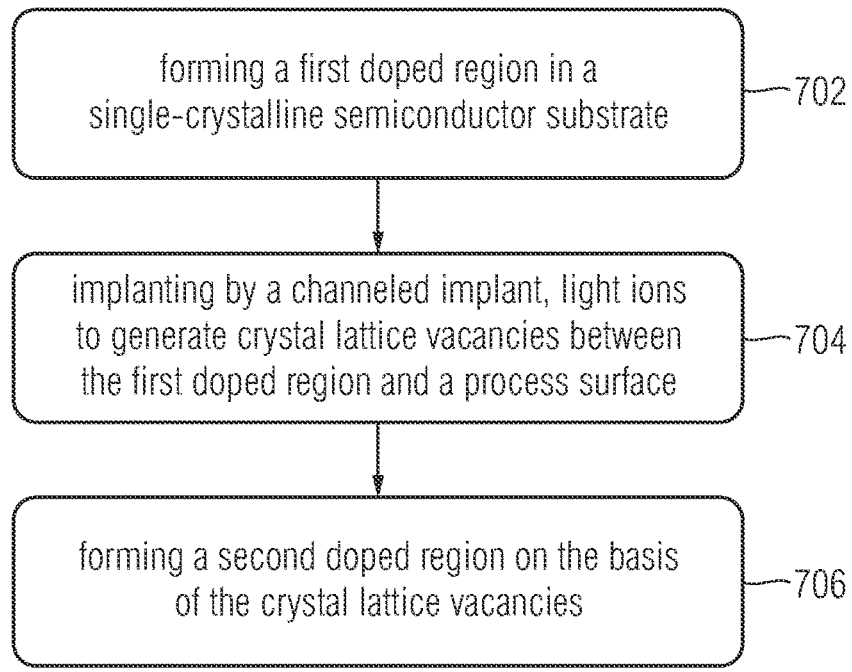
FIG. 8A is a simplified flowchart of a method of manufacturing a semiconductor device according to a further embodiment.

FIG. 8A refers to a method of manufacturing a semiconductor device. A first doped region is formed in a single-crystalline semiconductor substrate (702). Through a process surface light ions are implanted into the semiconductor substrate by a channeled light ion implant to generate crystal lattice vacancies between the first doped region and the process surface (704). Based on the crystal lattice vacancies a second doped region is formed that has a conductivity type opposite to the first doped region (706).

Figure 8B:
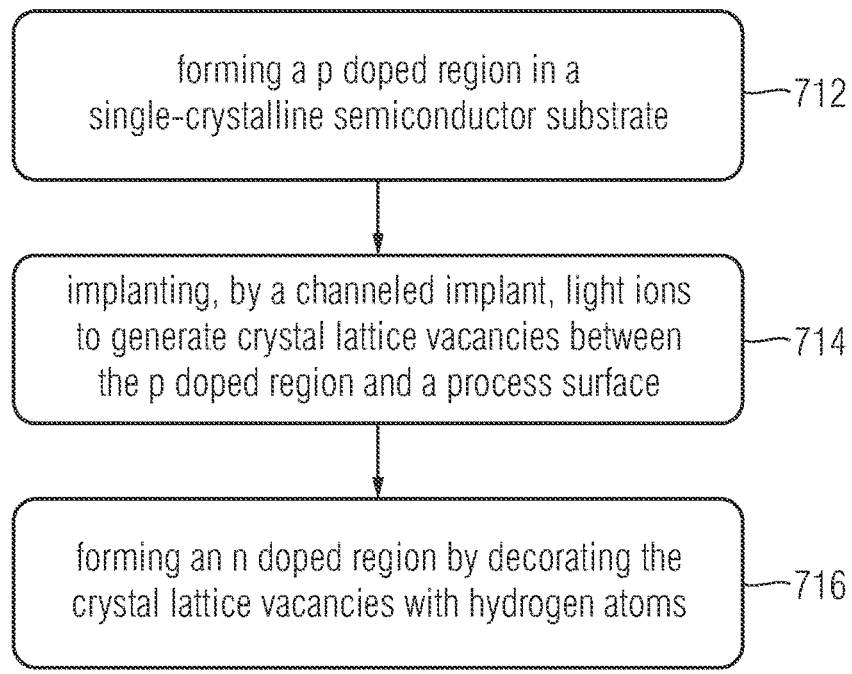
FIG. 8B is a simplified flowchart of a method of manufacturing a semiconductor device according to another embodiment related to HDs.

FIG. 8B refers to a further method of manufacturing a semiconductor device. A p doped region is formed in a single-crystalline semiconductor substrate (712). Through a process surface light ions are implanted into the semiconductor substrate by a channeled light ion implant to generate crystal lattice vacancies between the p doped region and the process surface (714). By decorating the crystal lattice vacancies with hydrogen atoms an n doped region is formed (716).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising:
forming a first doped region in a single crystalline semiconductor substrate;
implanting light ions through a process surface into the semiconductor substrate to generate crystal lattice vacancies between the first doped region and the process surface, wherein a main beam axis of an implant beam used for implanting the light ions deviates by at most 1.5 degree from a main crystal direction along which channeling of the light ions occurs; and
forming a second doped region with a conductivity type opposite to the first doped region based on the crystal lattice vacancies and hydrogen atoms.

2. The method of claim 1, wherein
an incidence angle variability of the implant beam is at most ±0.5 degree for at least 80% of the process surface.

3. The method of claim 2, wherein:
the semiconductor substrate has a diamond cubic crystal lattice;
the process surface deviates from a {100} crystal face by at most ±2 degree; and
the main crystal direction is the <100> direction.

4. The method of claim 1, wherein
an oxygen concentration in the semiconductor substrate is at least 1E15 cm$^{-3}$ and/or a carbon concentration in the semiconductor substrate is at least 1E13 cm$^{-3}$.

5. The method of claim 1, further comprising:
forming insulated gate field effect transistor cells between a front surface opposite to the process surface and the second doped region, wherein portions of the first doped region form body zones of the transistor cells and the transistor cells are configured to control a current flow through the semiconductor substrate between the front surface and the process surface.

6. The method of claim 1, wherein:
the light ions are implanted in two or more implants at different acceleration energies; and
a dose of the two or more implants decreases with increasing acceleration energy.

7. The method of claim 1, further comprising:
implanting light ions at an implant angle between the main beam axis and the main crystal direction greater 1.5 degree.

8. The method of claim 7, wherein
the implant angle is at least 3.5 degree.

9. The method of claim 8, wherein
an acceleration energy of any implant implanting the light ions at a deviation of the main beam axis from the main crystal direction by at least 3.5 degree is lower than an implant energy of at least one implant implanting the light ions at a deviation of the main beam axis from the main crystal direction by at most 1.5 degree.

10. The method of claim 1, wherein
the semiconductor substrate is a silicon substrate and the first doped region is p doped.

11. The method of claim 10, wherein
before forming the first and second doped regions, an initial net dopant concentration in the semiconductor substrate is lower than 1E14 cm$^{-3}$.

12. The method of claim 1, further comprising:
measuring an initial net dopant concentration in the semiconductor substrate before forming the first and second doped regions; and
determining implantation parameters of at least one implant with the main beam axis deviating from the main crystal direction by at most 1.5 degree so as to compensate for a deviation of the initial net dopant concentration from a target value in at least a section of the semiconductor substrate.

13. The method of claim 1, further comprising:
adjusting a base doping of the semiconductor substrate by tempering, after the channeled implant of light ions, the semiconductor substrate at a temperature above a formation temperature of oxygen thermal donors.

14. The method of claim 1, further comprising:
forming, before implanting light ions, an implant mask covering first portions of the semiconductor substrate and exposing second portions of the semiconductor substrate.

15. The method of claim 14, wherein
the implant mask shadows the first portions against the light ions.

16. The method of claim 14, wherein
the implant mask scatters the light ions off from the main beam axis.

17. A method of manufacturing a semiconductor device, the method comprising:
forming a p doped region in a single crystalline silicon substrate;
implanting light ions through a process surface into the semiconductor substrate to generate crystal lattice vacancies between the p doped region and the process surface, wherein a main beam axis of an implant beam used for implanting the light ions deviates by at most 1.5 degree from a main crystal direction, along which channeling of the implant light ions occurs; and
forming an n doped region by generating hydrogen-related donors at the crystal lattice vacancies.

* * * * *